(12) United States Patent
Yen et al.

(10) Patent No.: US 8,956,963 B2
(45) Date of Patent: Feb. 17, 2015

(54) SCHOTTKY BARRIER DIODE AND FABRICATING METHOD THEREOF

(71) Applicant: Industrial Technology Research Institute, Hsinchu (TW)

(72) Inventors: Cheng-Tyng Yen, Kaohsiung (TW); Kuan-Wei Chu, Zhubei (TW); Lurng-Shehng Lee, Hsinchu County (TW); Chwan-Ying Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/933,731

(22) Filed: Jul. 2, 2013

(65) Prior Publication Data

US 2014/0145207 A1     May 29, 2014

(30) Foreign Application Priority Data

Nov. 27, 2012 (TW) .............................. 101144350 A

(51) Int. Cl.
    *H01L 29/872*          (2006.01)
    *H01L 29/66*            (2006.01)
    *H01L 29/16*            (2006.01)

(52) U.S. Cl.
    CPC ........ *H01L 29/8725* (2013.01); *H01L 29/6606* (2013.01); *H01L 29/1608* (2013.01)
    USPC ........... 438/571; 438/572; 438/576; 438/578; 257/76; 257/77; 257/486

(58) Field of Classification Search
    CPC ............ H01L 21/0435; H01L 21/0495; H01L 21/28537; H01L 21/28581; H01L 27/0766; H01L 29/0619; H01L 29/47; H01L 29/435; H01L 29/66143; H01L 29/66212; H01L 29/7806; H01L 29/872; H01L 31/07; H01L 31/108; H01L 31/1085
    USPC ........... 438/570–583, 270; 257/341, 333, 76, 257/77, 486
    See application file for complete search history.

(56) References Cited

U.S. PATENT DOCUMENTS

| | | |
|---|---|---|
| 5,262,668 A | 11/1993 | Tu et al. |
| 5,365,102 A | 11/1994 | Mehrotra et al. |

(Continued)

FOREIGN PATENT DOCUMENTS

| | | |
|---|---|---|
| CN | 101800252 | 8/2001 |
| TW | I366235 | 6/2012 |

OTHER PUBLICATIONS

K.J. Schoen et al., "A Dual-Metal-Trench Schottky Pinch-Rectifier in 4H-SiC," IEEE Electron Device Letters, vol. 19, No. 4, Apr. 1988, pp. 97-99.

(Continued)

*Primary Examiner* — William F Kraig
*Assistant Examiner* — Pavel Ivanov
(74) *Attorney, Agent, or Firm* — Muncy, Geissler, Olds & Lowe, P.C.

(57) ABSTRACT

A Schottky barrier diode and fabricating method thereof are disclosed. A semiconductor substrate may have a first surface and a second surface positioned oppositely to be provided. Several trenches are formed on the first surface. Each trench has a sidewall with a first depth and a first bottom surface. An insulating material is formed on the first surface of the semiconductor substrate and on the sidewall and the first bottom surface of each trench, wherein the insulating material has a first thickness on the sidewall. The insulating material on the sidewall is patterned to define a second bottom surface having a second depth smaller than the first depth, and the removed portion of the insulating material on the sidewall has a second thickness smaller than the first thickness. Afterward, a contact metal layer is at least formed on the first surface between adjacent trenches.

9 Claims, 8 Drawing Sheets

(56) References Cited

U.S. PATENT DOCUMENTS

| | | | |
|---|---|---|---|
| 5,612,567 | A | 3/1997 | Balilga |
| 6,291,298 | B1 | 9/2001 | Williams et al. |
| 6,309,929 | B1 | 10/2001 | Hsu et al. |
| 6,441,454 | B2 * | 8/2002 | Hijzen et al. ............... 257/483 |
| 6,855,593 | B2 | 2/2005 | Audoh et al. |
| 7,416,947 | B2 | 8/2008 | Darwish |
| 7,488,673 | B2 | 2/2009 | Sanfilippo et al. |
| 7,754,550 | B2 | 7/2010 | Chiola et al. |
| 8,143,655 | B2 | 3/2012 | Chiola |
| 2002/0030237 | A1 * | 3/2002 | Omura et al. ............... 257/397 |
| 2005/0127465 | A1 * | 6/2005 | Chiola ............... 257/471 |
| 2006/0157745 | A1 * | 7/2006 | Lanois ............... 257/256 |
| 2010/0289109 | A1 | 11/2010 | Henning et al. |
| 2010/0308337 | A1 | 12/2010 | Sriram et al. |

OTHER PUBLICATIONS

M. Östling et al., "SiC power devices—present status, applications and future persepective," Proceedings of the $23^{rd}$ International Symposium on Power Semiconductor Devices & IC's, May 23-26, 2011, pp. 10-15.

C.T. Yen et al., "Characteristics of 4H-SiC Dual-Metal and MOS Trench Schottky Rectifiers," CS MANTECH Conference, Apr. 23-26, 2012.

B.J. Baglia, "Chapter 5 Trench MOS Barrier Controlled Schottky Rectifiers," Advanced Power Rectifier Concepts, 2009, pp. 117-150.

V. Khemka et al., "A Fully Planarized 4H-SiC Trench MOS Barrier Schottky (TMBS) Rectifier," IEEE Electron Device Letters, vol. 21, No. 5, May 2000, pp. 286-288.

* cited by examiner

SCHOTTKY BARRIER DIODE AND FABRICATING METHOD THEREOF

This application claims the benefit of Taiwan application Serial No. 101144350, filed Nov. 27, 2012, the disclosure of which is incorporated by reference herein in its entirety.

TECHNICAL FIELD

The disclosure relates in general to a diode and fabricating method thereof, and more particularly to a trench Schottky barrier diode and a fabricating method thereof.

BACKGROUND

A Schottky barrier diode is an unipolar device in which electrons serve as the main charge carriers for transporting current. The device has a low forward voltage drop and a fast switching. However, the leakage current of Schottky diodes increases as reverse bias increases because of the lowering of Schottky barrier under high electric field. To reduce the leakage current at the reverse bias, a high work function metal is usually used to provide a high Schottky barrier, which will in turn increase the forward voltage drop and turn-on power loss of the device. The Schottky diode with a trench structure is one of solutions proposed to compromise above mentioned trade-offs.

SUMMARY

The disclosure is directed to a Schottky barrier diode and a fabricating method thereof capable of pinching reverse leakage current and increasing element reliability.

According to one embodiment, a fabricating method of a Schottky barrier diode is disclosed. The fabricating method may comprise a semiconductor substrate having a first surface and a second surface positioned oppositely to be provided, and a plurality of trenches formed on the first surface of the semiconductor substrate. Each trench has a sidewall with a first depth and a first bottom surface. An insulating material is formed on the first surface and on the sidewall and the first bottom surface of each trench, wherein the insulating material has a first thickness on the sidewall of each trench. The insulating material on the sidewall is patterned (such as by etching) to define a second bottom surface of each trench, wherein the second bottom surface has a second depth smaller than the first depth, and the removed portion of the insulating material on the sidewall of each trench has a second thickness smaller than the first thickness. A contact metal layer is at least formed on the first surface between adjacent trenches.

According to another embodiment, a Schottky barrier diode comprising a semiconductor substrate, an insulating layer and a contact metal layer is disclosed. The semiconductor substrate, having a first surface and a second surface positioned oppositely, comprises a plurality of trenches formed on the first surface. The insulating layer is formed on the sidewall and the bottom surface of each trench, and the insulating layer comprises a first portion and a second portion. The first portion is extended downward from the first surface, and the second portion is located below the first portion, wherein the thickness of the second portion is larger than the thickness of the first portion. The contact metal layer is formed on the first surface between adjacent trenches. A Schottky barrier is formed between the contact metal layer and the semiconductor substrate.

The above and other aspects of the disclosure will become better understood with regard to the following detailed description of the non-limiting embodiment (s). The following description is made with reference to the accompanying drawings.

Figure 1A:
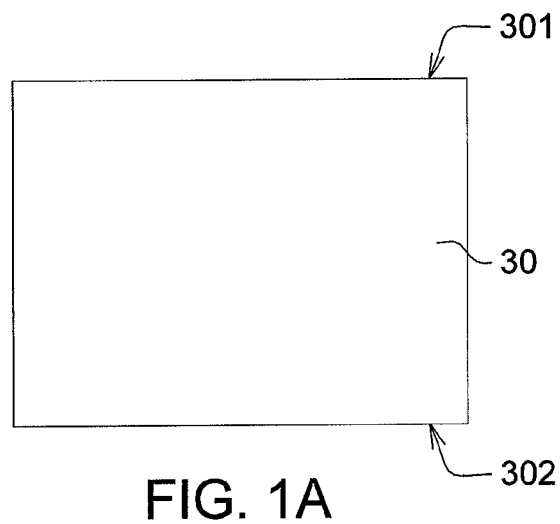
FIG. 1A-FIG. 1M illustrate a method of fabricating a Schottky barrier diode according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A Schottky barrier diode and a fabricating method thereof are disclosed below. A thinner insulating layer is formed on an upper portion of a sidewall of each trench for effectively suppressing the reverse leakage current, and a thicker insulating layer is formed on a lower portion and a bottom of the sidewall of each trench for improving device reliability. The embodiments of the disclosure are elaborated with reference to accompanying drawings. It is noted that details of the structure and the fabricating method disclosed in the embodiments are for exemplary and explanatory only, not for limiting the scope of protection of the disclosure. Moreover, the drawings are simplified for elaborating the embodiments, and the dimensions of the drawings are not based on actual proportions of the products, and are for reference only not for limiting the scope of protection of the disclosure.

FIG. 1A-FIG. 1M illustrate a method of fabricating a Schottky barrier diode according to an embodiment of the disclosure. As indicated in FIG. 1A, a semiconductor substrate 30 is provided, and the semiconductor substrate 30 could be optionally subjected to surface cleaning (such as RCA clean) and pre-treatment (such as the growth and removal of a sacrificial insulating layer) processes. The semiconductor substrate 30 has a first surface 301 and a second surface 302 positioned oppositely. Similarly, the term of semiconductor substrate 30 used herein may comprise a highly doped layer (as a cathode region with a high concentration of about $1 \times 10^{19}$ cm$^{-3}$ of the first conductive type (such as n-type) dopant) and a drift layer (may having a carrier concentration of $1 \times 10^{15}$ cm$^{-3}$~$1 \times 10^{17}$ cm$^{-3}$), and would be interpreted as the meaning that is commonly understood by one of ordinary skill in the art to which the disclosure belong. In an embodiment, examples of the semiconductor substrate 30, formed by such as silicon carbide (4H—SiC), include a n-type silicon carbide substrate (/layer/region) with high doping concentration (n+ cathode region) and a n-type SiC epitaxial layer (as n-drift layer/region) with low doping concentration and formed on the substrate for supporting reverse bias. A suitable metal, such as nickel (Ni), can be used to form an ohmic contact at the bottom surface of the n+ substrate (after annealing at a suitable temperature, for example at 950°

C.). The semiconductor substrate 30 may also be formed by other wide bandgap semiconductor material such as gallium nitride (GaN).

Figure 1B:
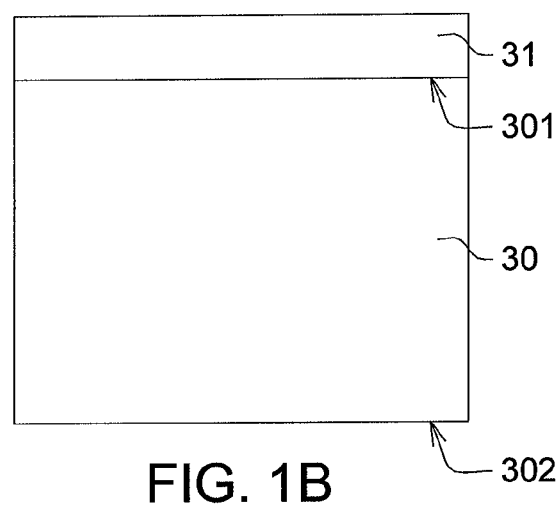
Figure 1C:
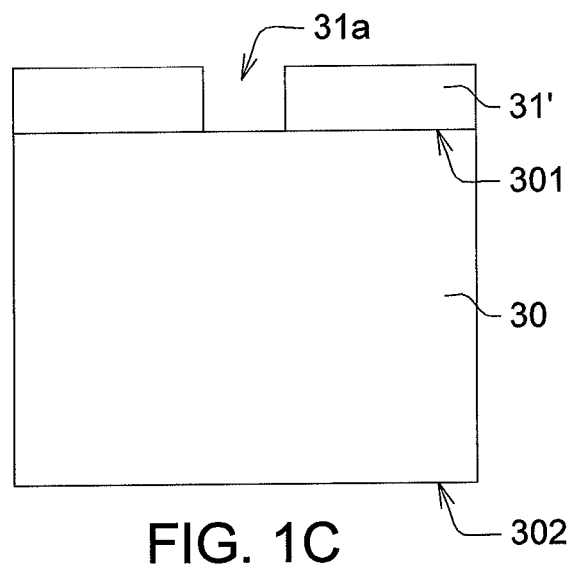

As indicated in FIG. 1B, a mask layer 31 is formed on a first surface 301 of the semiconductor substrate 30. Then, as indicated in FIG. 1C, an opening 31a, for subsequently fabricating trenches, is defined in the mask layer 31 to form a patterned mask 31'. The opening 31a exposes the first surface 301 of the semiconductor substrate 30. In an embodiment, an oxide layer is deposited as the mask layer 31, and the oxide layer is etched to form the opening 31a.

Figure 1D:
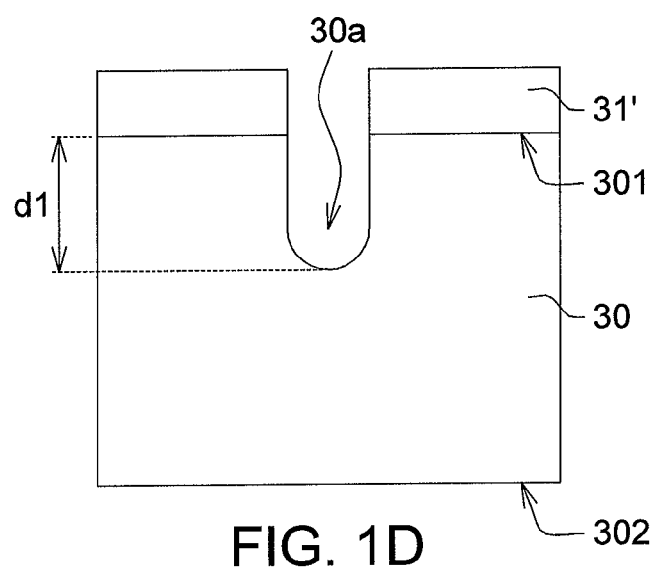
Figure 1E:
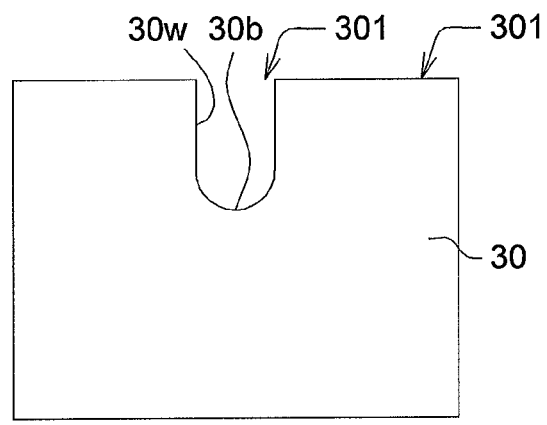

As indicated in FIG. 1D, the semiconductor substrate 30 is etched according to the patterned mask 31' to form a trench 30a. The trench 30a is extended downward from the first surface 301 of the semiconductor substrate 30, and has a sidewall 30w and a first bottom surface 30b with a first depth d1. In an embodiment, exemplarily but not restrictively, the first bottom surface 30b of the trench 30a is rounded. As indicated in FIG. 1E, the patterned mask 31' is removed.

Figure 1F:
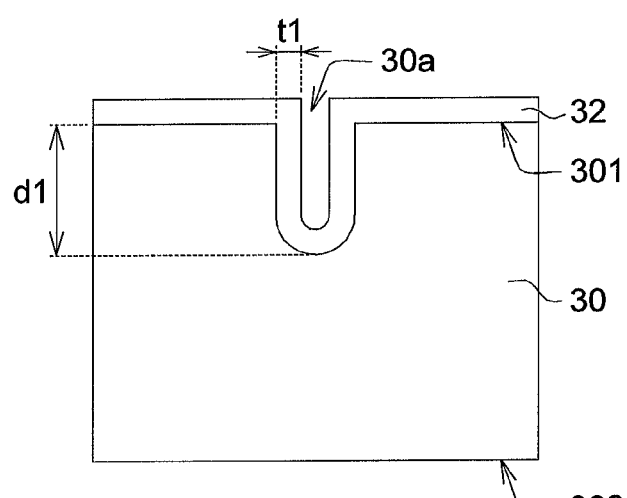

As indicated in FIG. 1F, an insulating material 32 is formed on the first surface 301 of the semiconductor substrate 30 and on the surface (including the sidewall 30w and the first bottom surface 30b) of the trench 30a, wherein the insulating material 32 has a first thickness t1 on the sidewall 30w of each trench 30a. In an embodiment, the insulating material 32 could be formed by first growing a silicon oxide layer (having a thickness of such as 0.1 μm) by a thermal oxidation process in a high temperature furnace, and then depositing an conformal silicon oxide layer by chemical vapor deposition (CVD) (having a thickness of such as 0.1 μm). However, the disclosure is not limited thereto. For example, a thicker silicon oxide 32 can be directly grown/deposited (having a thickness of such as 0.2 μm) by CVD or high temperature furnace. Alternatively, a silicon oxide having a certain thickness is first grown in a high temperature furnace, and then other insulating material (such as silicon nitride or aluminum oxide) is deposited. Or, other insulating material (such as silicon nitride or alumina) having a certain thickness is first deposited, and then a silicon oxide is deposited.

The insulating material on the sidewall 32 of each trench 30a is patterned (such as by etching) to define a second bottom surface 30c of each trench (referring to FIG. 1K), wherein the second bottom surface 30c has a second depth d2 smaller than the first depth d1, and the etched portion of the insulating material on the sidewall of each trench has a second thickness t2 smaller than the first thickness t1. Exemplary but not restrictive details of related steps are disclosed below.

Figure 1G:
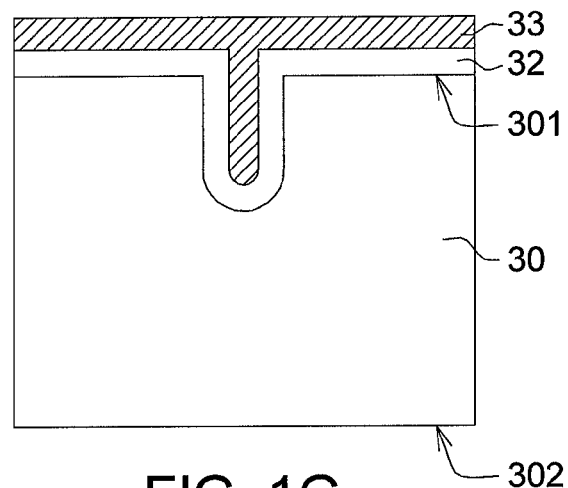
Figure 1H:
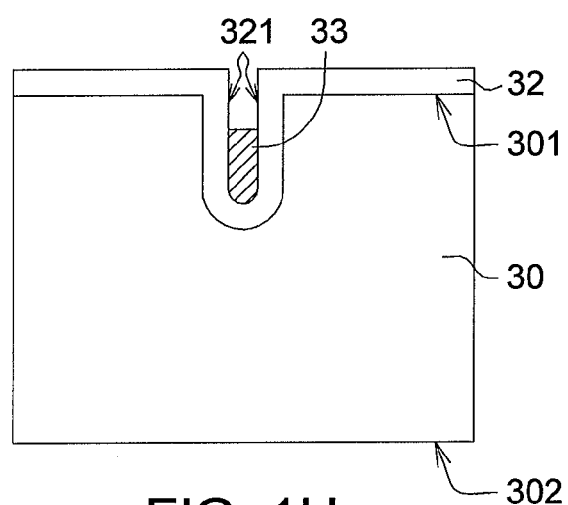

As indicated in FIG. 1G, a photoresist 33 is formed on the insulating material 32 such as by spin-coating. Then, a portion of the photoresist 33 is removed by etching back to expose the insulating material 32 on the first surface 301 and expose an upper portion 321 of the insulating material 32 on the sidewall 30w of each trench 30a, as shown in FIG. 1H. The photoresist 33 and the coating process can be replaced by other material and other process capable of performing similar functions. For example, the photoresist 33 can be replaced by a spin-on glass (SOG) or an anti-reflection coating (ARC) material.

Figure 1I:
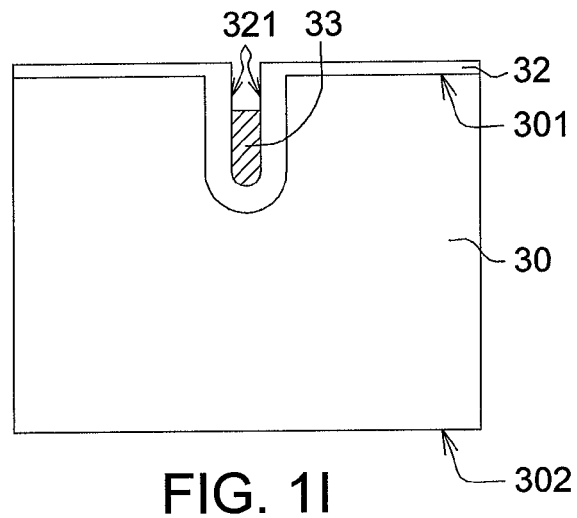
Figure 1J:
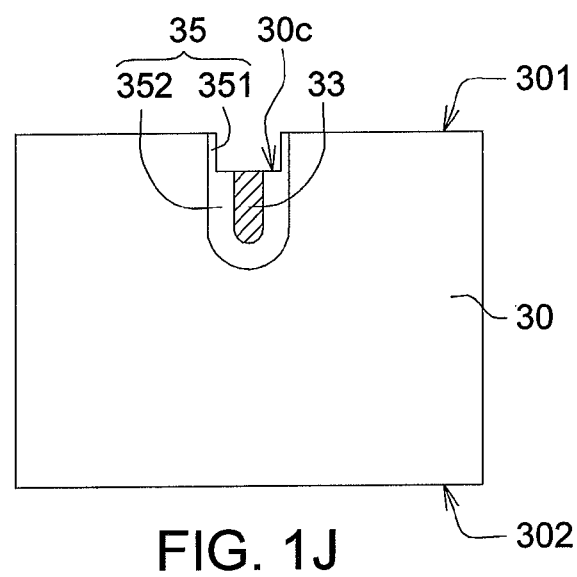

Then, a portion of the upper portion 321 of the insulating material 32 is removed to form a first portion 351 of the insulating layer. In an embodiment, a portion of the insulating material 32 on the first surface 301 is removed by an anisotropic etching process to reduce the thickness of the insulating material 32, as shown in FIG. 1I. Then, an isotropic etching process is used to remove the remaining insulating material 32 on the first surface 301 and remove the upper portion 321 of the insulating material 32 of the trench 30a to form the first portion 351 of the insulating layer 35, as shown in FIG. 1J, and the second bottom surface 30c of each trench is formed.

Figure 1K:
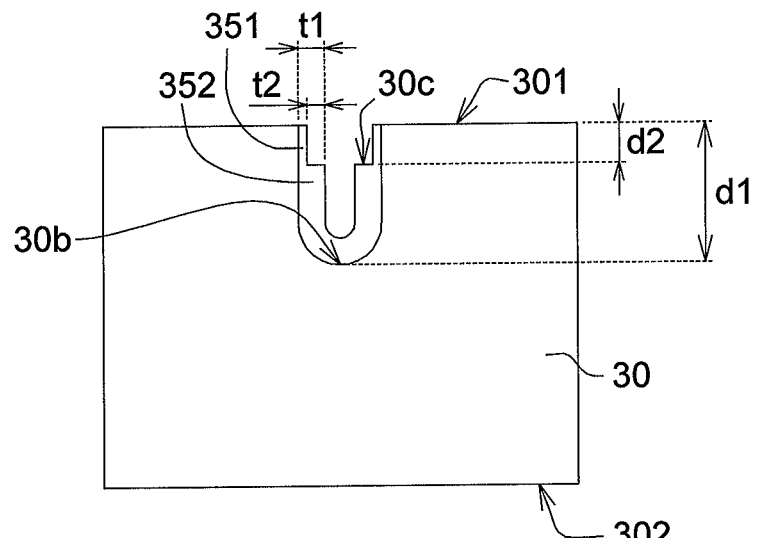

The residual photoresist 33 in the trench is removed to form the second portion 352 of the insulating layer 35, as shown in FIG. 1K.

According to the embodiment, the insulating layer 35 in the trench 30a has two different thicknesses, including a first portion 351 and a second portion 352. The first portion 351 is extended downward from the first surface 301, and the thickness of the first portion 351 is the difference t1−t2 between the first thickness t1 and the second thickness t2. The second portion 352 is located below the first portion 351 and has a second thickness t2 smaller than the first thickness t1. The depth of the first portion 351 of the insulating layer 35 corresponds to the second depth d2, and the depth of the second portion 352 corresponds to the difference d1−d2 between the first depth d1 and the second depth d2, wherein the second depth d2 is smaller than the first depth d1. The first depth d1 could also be regarded as a total depth of the trench. In one embodiment, the depth of the first portion 351 of the insulating layer 35 is smaller than the depth of the second portion 352, but the disclosure is not limited thereto. In one embodiment, the ratio of the thickness (t1-t2) of the first portion 351 to the second thickness (t2) ranges between 0.01~0.9, and the ratio of the second depth d2 to the total depth (that is, d1) of the trench ranges between 0.01~0.9.

Figure 1L:
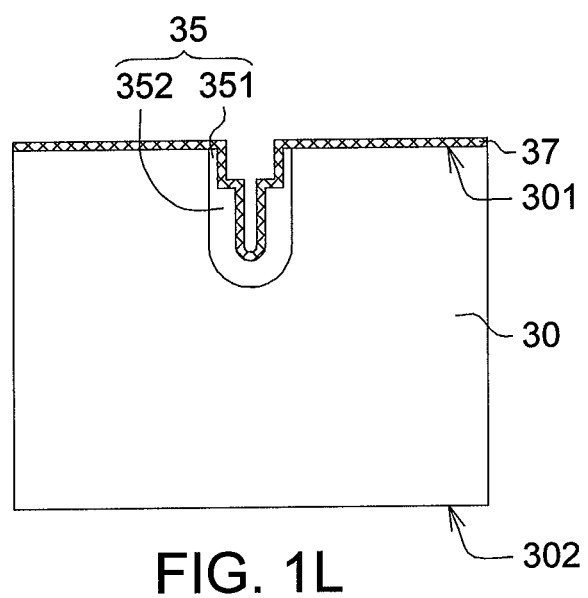

A contact metal layer 37 (Schottky metal) is formed at least on the first surface 301 between adjacent trenches 30a, wherein a Schottky barrier is formed between the contact metal layer 37 and the semiconductor substrate 30. In an embodiment as indicated in FIG. 1L, a contact metal layer 37 is deposited on the first surface 301 of the semiconductor substrate 30 and is extended to cover the insulating layer 35.

The material for the contact metal layer 37 include titanium (Ti), molybdenum (Mo), aluminum (Al), magnesium (Mg), tungsten (W), silver (Ag), alloys or metal silicides comprising above metals, and other metals with suitable work function.

Figure 1M:
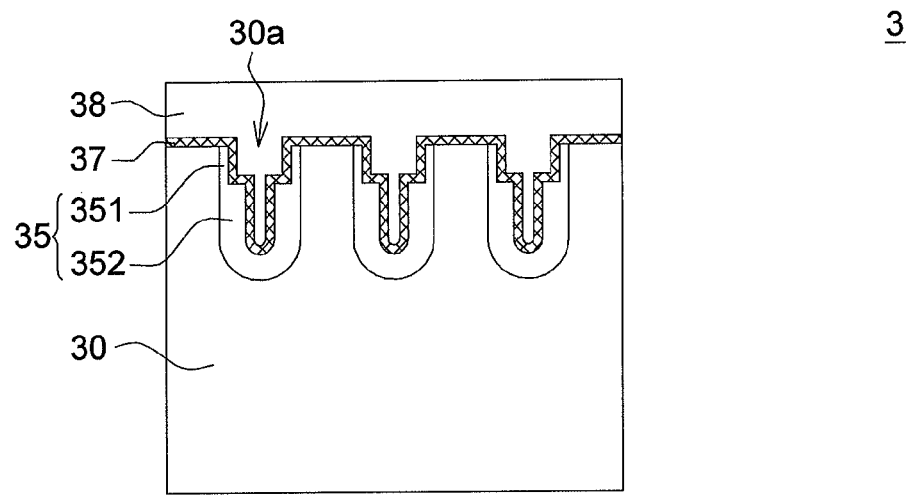

A conductive layer 38 can be formed on the semiconductor substrate 30 to cover the contact metal layer 37 and fill up the trench 30a, as shown in FIG. 1M. The conductive layer 38 can be formed by materials such as aluminum, an aluminum-containing alloy or other suitable materials for electrode pads.

In the Schottky barrier diode 3 obtained according to the fabricating method disclosed in the above embodiments (referring to FIG. 1K and FIG. 1L), a thinner insulating layer (i.e. the first portion 351) is formed on the upper portion of the sidewall of the trench 30a for effectively suppressing the reverse leakage current, and a thicker insulating layer (i.e. the second portion 352) is formed on the lower portion and the bottom of the sidewall of the trench 30a for improving device reliability.

As shown in FIG. 1M, the contact metal layer 37 is formed on the first surface 301 of the semiconductor substrate 30 and is extended to cover the insulating layer 35. However, the disclosure is not limited to the structure as exemplified in FIG. 1M. Corresponding design and modification can be made according to the structure of the Schottky barrier diode in practical applications, and the fabricating method thereof can be modified and adjusted with reference to the above procedures and steps.

Figure 2:
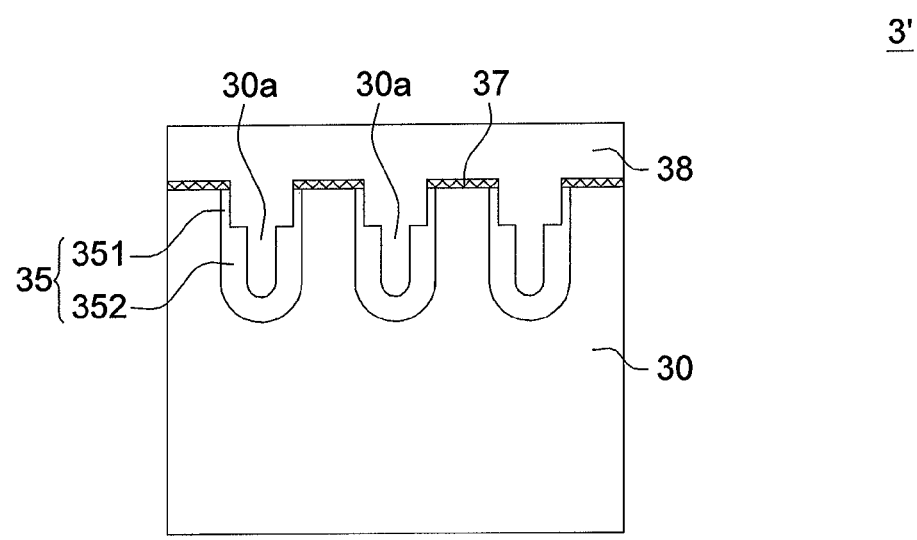
FIG. 2 shows a schematic diagram of a Schottky barrier diode according to another embodiment of the disclosure.

FIG. 2 shows a schematic diagram of a Schottky barrier diode according to another embodiment of the disclosure. Common reference numerals are used throughout the drawings and the detailed description to indicate the same elements, and the similarities are not repeated. As indicated in the Schottky barrier diode 3' of FIG. 2, the contact metal layer 37 is formed on the mesa, that is, the first surface 301 between adjacent trenches 30a, and the conductive layer 38 is formed on the semiconductor substrate 30 and fills up the trench 30a, i.e. the conductive layer 38 directly contacts the insulating layer 35.

Figure 3:
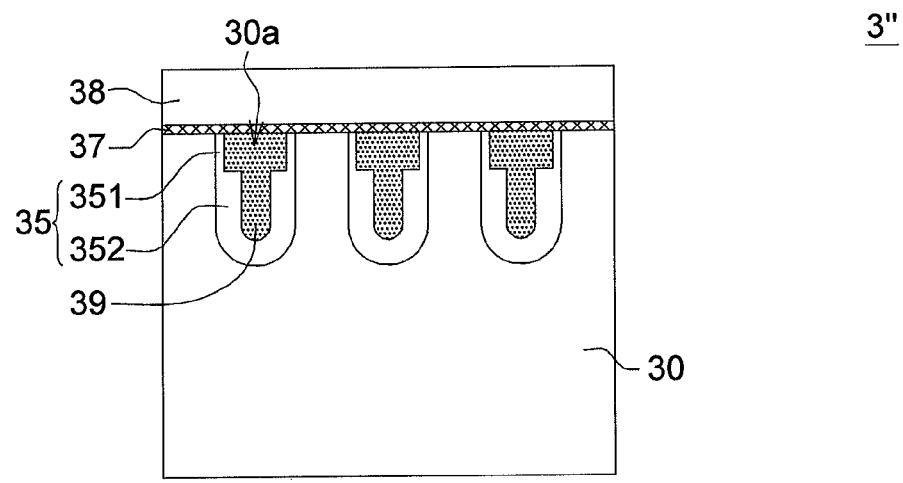
FIG. 3 shows a schematic diagram of a Schottky barrier diode according to a further embodiment of the disclosure.

FIG. 3 shows a schematic diagram of a Schottky barrier diode according to a further embodiment of the disclosure. Common reference numerals are used throughout the drawings and the detailed description to indicate the same elements, and the similarities are not repeated. As indicated in the Schottky barrier diode 3″ of FIG. 3, a conductive material 39 (such as polysilicon) fills up the trenches 30a, and the contact metal layer 37 is formed on the first surface 301 of the semiconductor substrate 30 and the conductive material 39. The conductive layer 38 is formed on the contact metal layer 37.

Apart from the above three types of structure, the Schottky barrier diode can be modified and adjusted according to the needs in actual application, and the disclosure is not limited thereto.

The Schottky barrier diode structure fabricated according to the above method has the feature that the insulating layer of the upper sidewall of the trench is thinner and the insulating layer of the lower sidewall and the bottom of the trench is thicker. The thinner insulating layer of the upper sidewall can effectively form a depletion region while provided a reverse bias, to reduce the reverse leakage current, and the thicker insulating layer of the lower sidewall and the bottom can provide good blocking capability and reliability. In practical applications, the photoresist etching back (PR etching back) and the anisotropic/isotropic etching process of the insulating material 32 can be further optimized with respect to the conditions of application for improving the performance of the devices.

<Related Experiments>

Figure 4:
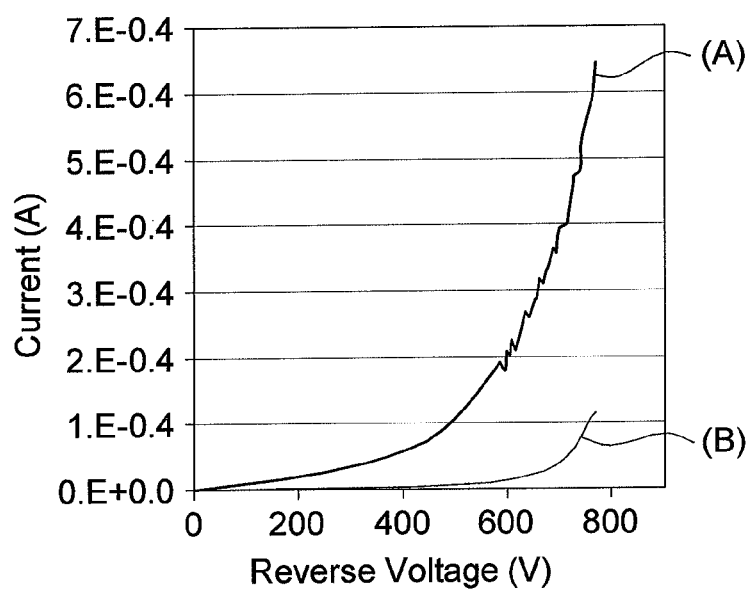
FIG. 4 shows relationships between the reverse leakage current and the reverse voltage of two structures of Schottky barrier diodes.

Experiments on device characteristics are performed with respect to different structures of Schottky barrier diodes. However, the disclosure is not restricted by the experimental data. FIG. 4 shows relationships between the reverse leakage current and the reverse voltage of two structures of Schottky barrier diodes. The base materials used in the experiments comprise a n-type SiC substrate with a thickness of 380 μm and a doping concentration of $1E19$ $cm^{-3}$, and a n-type SiC drift layer with a thickness of 11 μm and a doping concentration of $6E15$ $cm^{-3}$. The trenches are formed on a top surface of the base material, wherein the width of the mesa is 2 μm. The Schottky contact on the surface of the Schottky barrier diode is formed by depositing 100 nm of titanium (Ti) and annealing at 500° C. The Ohmic contact on the bottom surface of the base material is formed by depositing 100 nm of nickel (Ni) and annealing at 950° C. Please refer to FIG. 1K. In the experiment, two types of Schottky barrier diodes are measured. structure A, the insulating layer 35 (such as silicon oxide) includes the first portion 351 (formed on the upper part of the sidewall of the trench) with a thickness of 0.1 μm and a depth of 0.1 μm, and the second portion 352 (formed on the lower part of the sidewall of the trench) has a thickness of 0.2 μm and a depth of 1.9 μm. In structure B, the insulating layer 35 (such as silicon oxide) includes the first portion 351 (formed on the upper part of the sidewall of the trench) with a thickness of 0.1 μm and a depth of 0.5 μm, and the second portion 352 (formed on the lower part of the sidewall of the trench) with a thickness of 0.2 μm and a depth of 1.5 μm. The total depths of the insulating layers 35 (i.e. d1) of these two structures are the same. The depth of the thinner insulating layer (i.e. the first portion) in structure A (represented by the curve (A)) is smaller than the depth of the thinner insulating layer (i.e. the first portion) in structure B (represented by the curve (B)). The experimental results as illustrated in FIG. 4 show that the reverse leakage current of the structure B (curve (B)), in which the depth of the thinner insulating layer is larger than the depth of the thinner insulating layer in the structure A, is apparently improved without sacrificing the breakdown voltage.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method of fabricating a Schottky barrier diode, comprising:
   providing a semiconductor substrate having a first surface and a second surface positioned oppositely;
   forming a plurality of trenches on the first surface of the semiconductor substrate, and each of the trenches with a first depth having a sidewall and a first bottom surface;
   forming an insulating material on the first surface and on the sidewall and the first bottom surface of each of the trenches, wherein the insulating material has a first thickness on the sidewall of each of the trenches;
   patterning the insulating material on the first surface and the insulating material on the sidewall of each of the trenches so as to remove the insulating material on the first surface and to define a second bottom surface in each of the trenches, wherein the second bottom surface has a second depth smaller than the first depth, and an etched portion of the insulating material on the sidewall of each of the trenches has a second thickness smaller than the first thickness; and
   forming a contact metal layer at least on the first surface between the adjacent trenches.

2. The method according to claim 1, wherein the patterned insulating material has a first portion and a second portion;
   wherein the first portion is extended downward from the first surface, a thickness of the first portion is equal to a difference between the first thickness and the second thickness, and a depth of the first portion is same as the second depth; and
   the second portion is connected to and below the first portion, a thickness of the second portion is equal to the second thickness, and a depth of the second portion is equal to a difference between the first depth and the second depth;
   wherein a ratio of the thickness of the first portion to the thickness of the second portion is between 0.01 and 0.9, and a ratio of the depth of the second portion to the first depth is between 0.01 and 0.9.

3. The method according to claim 2, wherein the step of patterning the insulating material on the first surface and on the sidewall of each of the trenches comprises:
   forming a photoresist on the insulating material;
   removing a portion of the photoresist to expose the insulating material on the first surface and a portion of the insulating material on the sidewalls of the trenches;
   removing a portion of an upper portion of the insulating material on the sidewalls of the trenches to form the first portion; and
   removing the photoresist in the trenches to form the second portion.

4. The method according to claim 1, further comprises forming the contact metal layer on the patterned insulating material.

5. The method according to claim 1, wherein before forming the contact metal layer, the method further comprises forming a conductive layer in the trenches, such that the contact metal layer is formed on the first surface between the adjacent trenches and on the conductive layer.

6. The method according to claim 5, further comprising forming a second conductive layer on the contact metal layer.

7. The method according to claim 1, wherein in the step of forming the insulating material, the insulating material is formed by a thermal oxidation process followed by a chemical vapor deposition.

8. The method according to claim 1, wherein the semiconductor substrate comprises silicon carbide (SiC) or gallium nitride (GaN).

9. The method according to claim 1, wherein the contact metal layer comprises titanium, molybdenum, aluminum, magnesium, tungsten, or silver, or an alloy or a metal silicide of the above metals.

* * * * *